(12) United States Patent
Shiga (10) Patent No.: US 7,161,835 B2
(45) Date of Patent: Jan. 9, 2007

(54) NON-VOLATILE SEMICONDUCTOR MEMORY DEVICE

(75) Inventor: Hitoshi Shiga, Matsuyama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/957,826

(22) Filed: Oct. 5, 2004

(65) Prior Publication Data
US 2005/0135157 A1 Jun. 23, 2005

(30) Foreign Application Priority Data
Dec. 17, 2003 (JP) .............................. 2003-419379

(51) Int. Cl.
*G11C 16/06* (2006.01)
(52) U.S. Cl. ............................ 365/185.22; 365/185.11; 365/185.29
(58) Field of Classification Search ........... 365/185.22, 365/185.11, 185.29
See application file for complete search history.

(56) References Cited

U.S. PATENT DOCUMENTS 6,421,276 B1 * 7/2002 Goltman ................ 365/185.22
6,717,858 B1   4/2004 Kawai et al.
6,903,981 B1 * 6/2005 Futatsuyama et al. . 365/185.22
2003/0169630 A1   9/2003 Hosono et al.

FOREIGN PATENT DOCUMENTS

JP         2003-22681         1/2003

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor memory device including: a cell array with electrically rewritable and non-volatile memory cells arranged therein; a sense amplifier circuit configured to read data of and write data into the cell array; and a controller configured to control read, write and erase of the cell array, wherein the controller executes an erase sequence for erasing a selected block in the cell array in response to erase command and address input in such a way of: executing a first erase-verify operation for verifying an erase state of the selected block; ending the erase sequence if the erase state of the selected block has been verified by the first erase-verify operation; whereas executing an erase operation for the selected block if the erase state has not been verified.

20 Claims, 12 Drawing Sheets

NON-VOLATILE SEMICONDUCTOR MEMORY DEVICE

CROSS-REFERENCE TO RELATED APPLICATION

This application is based on and claims the benefit of priority from the prior Japanese Patent Application No. 2003-419379, filed on Dec. 17, 2003, the entire contents of which are incorporated herein by reference.

BACKGROUND OF THE INVENTION

1. Field of the Invention

This invention relates to an electrically rewritable and non-volatile semiconductor memory device (EEPROM).

2. Description of Related Art

An EEPROM flash memory is usually formed to have an erase unit larger than read or write unit, and this may cause the occupied area of decoders to be lessened. For example, a NAND-type flash memory has NAND cell units arranged therein, which constitute a cell array, each NAND cell unit having plural memory cell connected in series. Data erase is performed by a block which is defined as a set of NAND cell units arranged along a word line, while data read or write is performed by a page which is defined as a set of memory cells arranged along a word line.

The NAND-type flash memory is made to have a small unit cell size because plural memory cells which constitute a NAND cell unit are connected in series in such a manner that adjacent two memory cells share a source/drain diffusion layer. Further, the NAND-type flash memory device has a page buffer, which is possible to store read data or write data of one page (e.g., 512 Byte), and data input/output between the page buffer and I/O ports are serially transferred by a byte. Based on these features, the NAND-type flash memory shows a high performance when it is applied to, for example, electric cards for storing a large capacitive data such as image, animation, and music data.

To over-write data into a block, a block erase operation is automatically performed prior to the data write, following it data write is performed in the flash memory chip. To hold the data in the block to be over-written without erasing, it is required to perform a copy-write operation for transferring the data to one of other blocks (i.e., spare block) (refer to, for example, Unexamined Japanese Patent Application Publication No. 2003-233992).

It is usually a host device disposed outside of the flash memory chip that performs such a spare block management in the flash memory chip. However, the flash memory management data in the host device is not always identical with the internal state of the flash memory. For example, it may be happened an event that although the block erase has started in the flash memory in response to an instruction of the host device, the power supply is cut off, or the flash memory is drawn out from the system before completion of data erase. In this case, it will be happened a situation where in spite of that a block is designated as a spare block in the management information of the host device, it has not been erased in practice. To deal with this situation, it will be required to confirm that a spare block has been erased in practice prior to use it.

Therefore, it is necessary for the host device to send erase command and address to a flash memory prior to using a spare block therein for executing spare block erase. Such the erase sequence usually includes a pre-write or pre-program operation for reducing erase stress influences on the block prior to the block erase operation. If it is always required to adapt such the erase sequence to a spare block, which is supposed as having been erased, as it is, it will take a great time loss.

SUMMARY OF THE INVENTION

According to an aspect of the present invention, there is provided a semiconductor memory device including:

a cell array with electrically rewritable and non-volatile memory cells arranged therein;

a sense amplifier circuit configured to read data of and write data into the cell array; and a controller configured to control read, write and erase of the cell array, wherein the controller executes an erase sequence for erasing a selected block in the cell array in response to erase command and address input in such a way of: executing a first erase-verify operation for verifying an erase state of the selected block; ending the erase sequence if the erase state of the selected block has been verified by the first erase-verify operation; whereas executing an erase operation for the selected block if the erase state has not been verified.

DETAILED DESCRIPTION OF THE EMBODIMENTS

Illustrative embodiments of this invention will be explained with reference to the accompanying drawings below.

[Embodiment 1]

Figure 1:
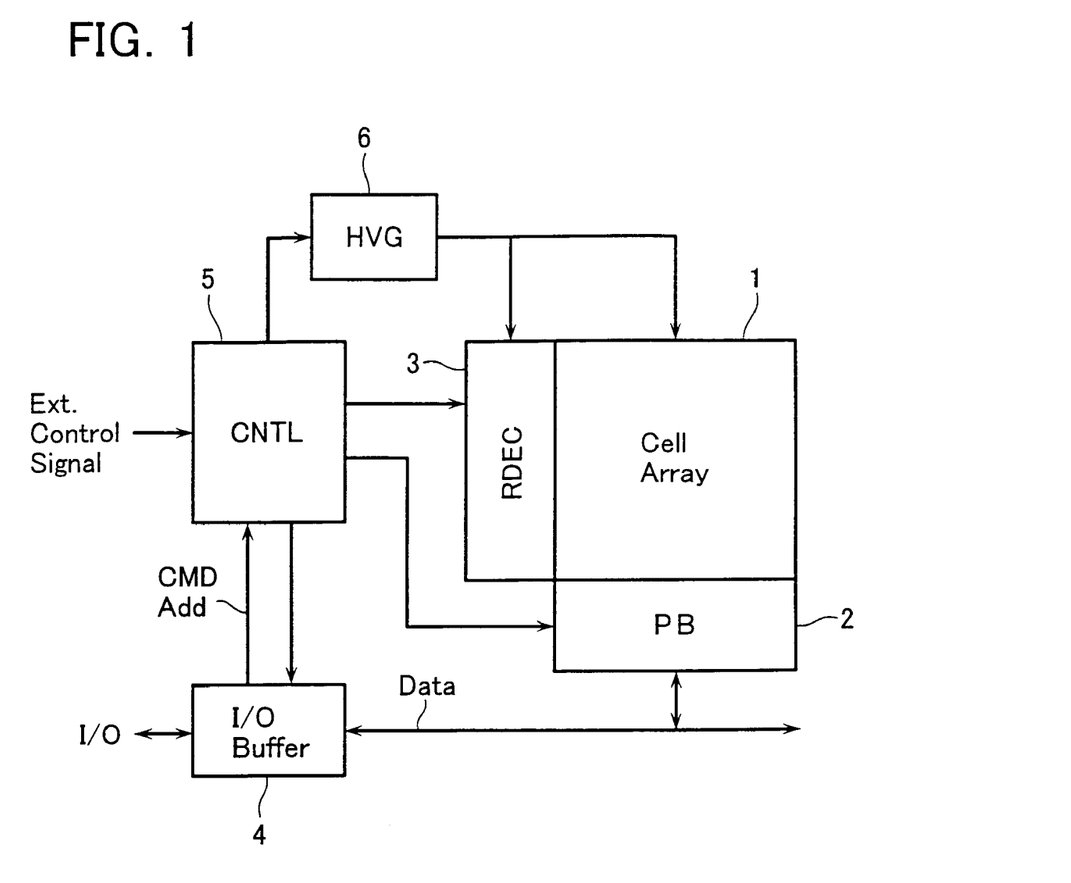
FIG. 1 is a block diagram showing a flash memory in accordance with an embodiment of the present invention.

FIG. 1 shows a functional block diagram of a NAND-type flash memory in accordance with an embodiment. A cell array 1 is, as described later, formed of NAND cell units arranged therein. A sense amplifier circuit 2, which serves as a page buffer, has sense amplifiers necessary for sensing one page read data and for holding one page write data, and a column gate circuit for serially transferring one page data. A row decoder 3 includes a word line driver and serves for selectively drive word lines of the cell array 1. Data transferring between the sense amplifier circuit 2 and external I/O terminals is done via I/O buffer 4.

To control write and erase sequences and a read operation in response to external control signals, a controller 5 is prepared. The controller 5 serves for receiving address "Add" and command "CMD" supplied from I/O terminals, to transmit the address to the row decoder 3 and page buffer 2, and perform operation controls instructed by the command. A high voltage generating circuit 6 generates various boosted voltages necessary for read, write and erase modes under the control of the controller 5.

Figure 2:
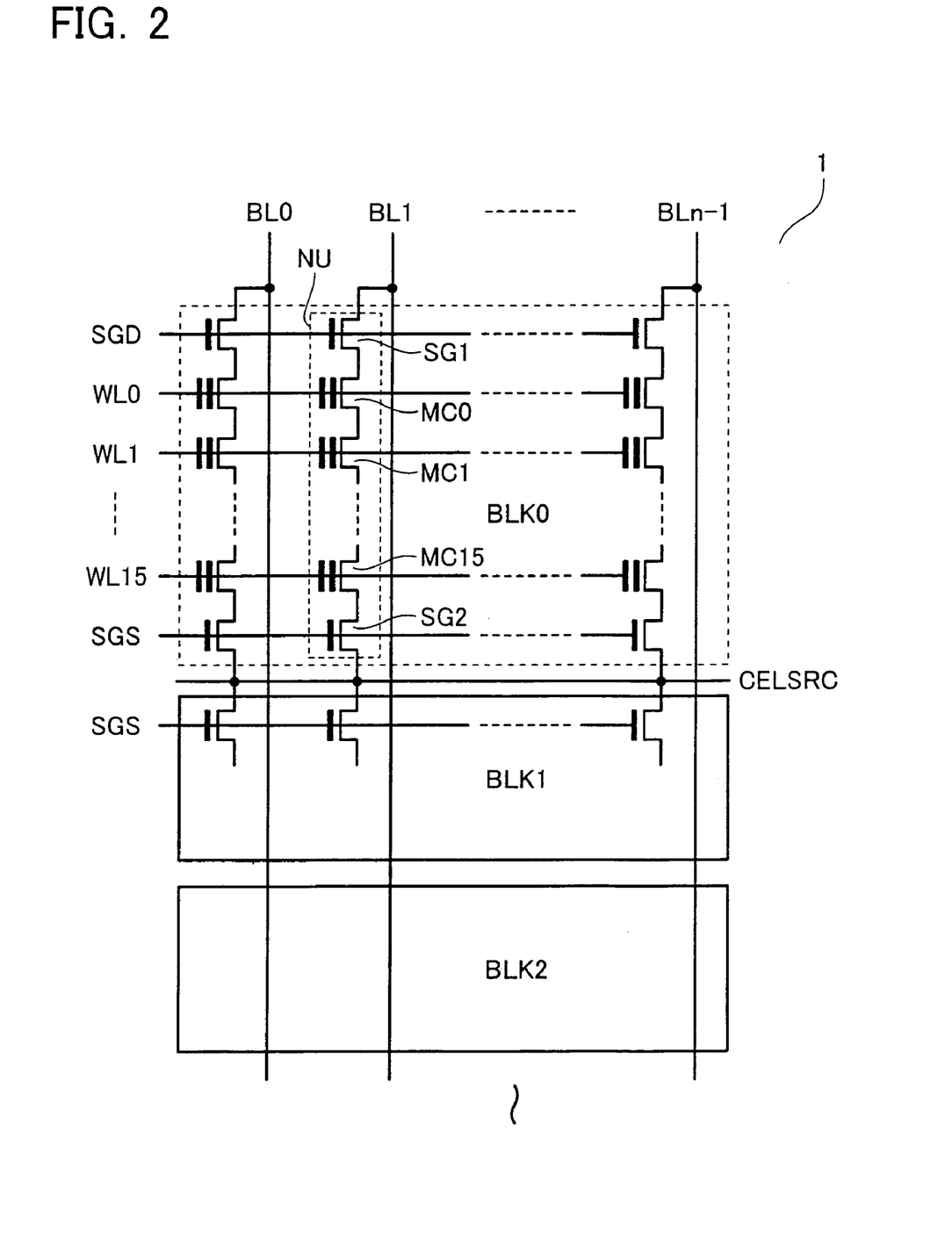
FIG. 2 shows a cell array arrangement of the flash memory.

FIG. 2 shows a detailed arrangement of the cell array 1. A plurality of memory cells (e.g., sixteen cells in this case) MC0–MC15 are connected in series to constitute a NAND cell unit NU. These plural NAND cell units are arranged in a matrix manner. Each memory cell MCi is a stacked-gate transistor, which has a data storage layer formed of, for example, a floating gate, and stores a threshold voltage as a data in a non-volatile manner, which is defined by a charge storage state. The cell data is electrically rewritable by electron injection into the floating gate and releasing the stored charge.

One end of the NAND cell unit NU is coupled to a bit line BL via a select gate transistor SG1, and the other end to a common source line CELSRC via another select gate transistor SG2. Control gates of the memory cells in a NAND cell unit NU are coupled to different word lines WLi. Gates of the select gate transistors SG1 and SG2 are coupled to select gate lines SGD and SGS, respectively, which are disposed in parallel with the word lines WLi.

One page, which is defined as a set of memory cells arranged along a word line, serves as a unit of data read and write. A set of NAND cell units share word lines, which is defined as a block, serves as a unit of data erase. Usually, a plurality of blocks BLKj (j=0, 1, . . . ) are arranged in the direction of the bit line BL.

Figure 3:
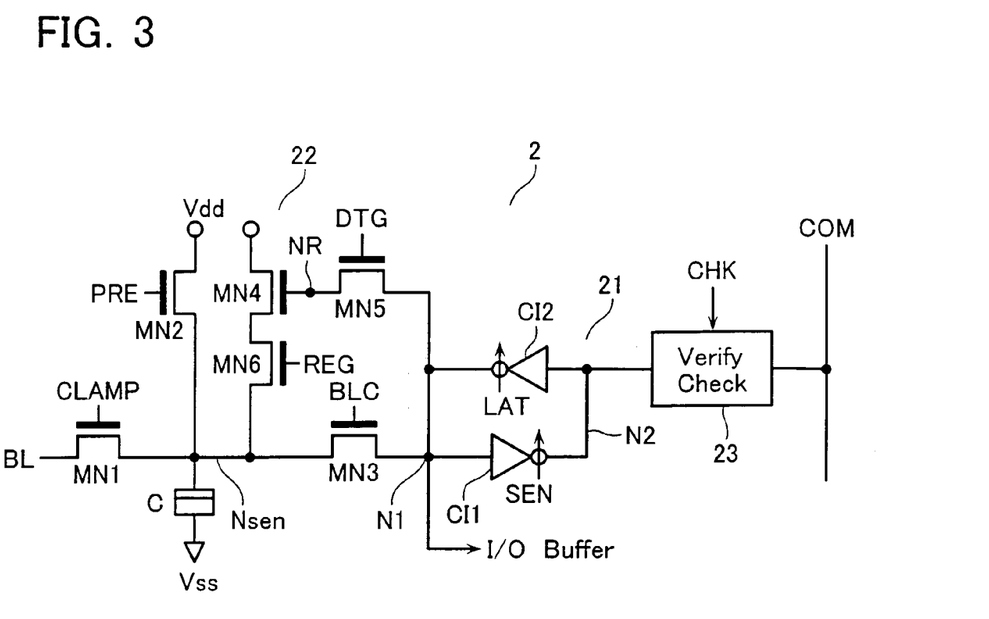
FIG. 3 shows a configuration of a page buffer of the flash memory.

FIG. 3 shows a configuration of a sense amp unit in the page buffer 2. An NMOS transistor MN1 disposed between a sense node Nsen and a bit line BL serves for clamping the bit line precharged voltage and as a pre-sense for amplifying bit line voltage. Further, to the sense node Nsen, a precharging NMOS transistor MN2 is coupled, and if necessary a capacitor C is coupled.

The sense node Nsen is connected to a data node N1 of a dada latch 21 via a transferring NMOS transistor MN3. The data latch 21 is formed of clocked inverters CI1 and CI2 connected in parallel and in the reversed direction between data node N1 and N2.

Disposed between the sense node Nsen and data node N1 is a write-back circuit 22, which stores write data in each write cycle to write back in accordance with each verify-read result. The gate of an NMOS transistor MN4, drain of which is connected to a power supply node Vdd, serves as a data storage node NR. Between this storage node NR and the data node N1, a data transferring NMOS transistor MN5 is disposed. To write back data, Vdd or Vss, to the sense node in accordance with the data stored at the node NR, an NMOS transistor MN6 is disposed between the NMOS transistor MN4 and the sense node Nsen.

Connected to the data node N2 is a verify-check circuit 23. This verify-check circuit 23 is to check whether write of erase has been completed or not by use of a check signal CHK after verify-reading in the write-verify or erase-verify. With respect to the erase-verify, the verify-check circuit 23 detects whether the data node N2 in the sense amplifier has become "H" or not. In other words, the verify-check circuit 23 is configured to determine the potential of the common signal line COM based on an AND logic of the entire data nodes N2 of all sense amplifiers. The controller 5 monitors this signal line COM to judge whether the verify result is "Pass" or "Fail".

Figure 4:
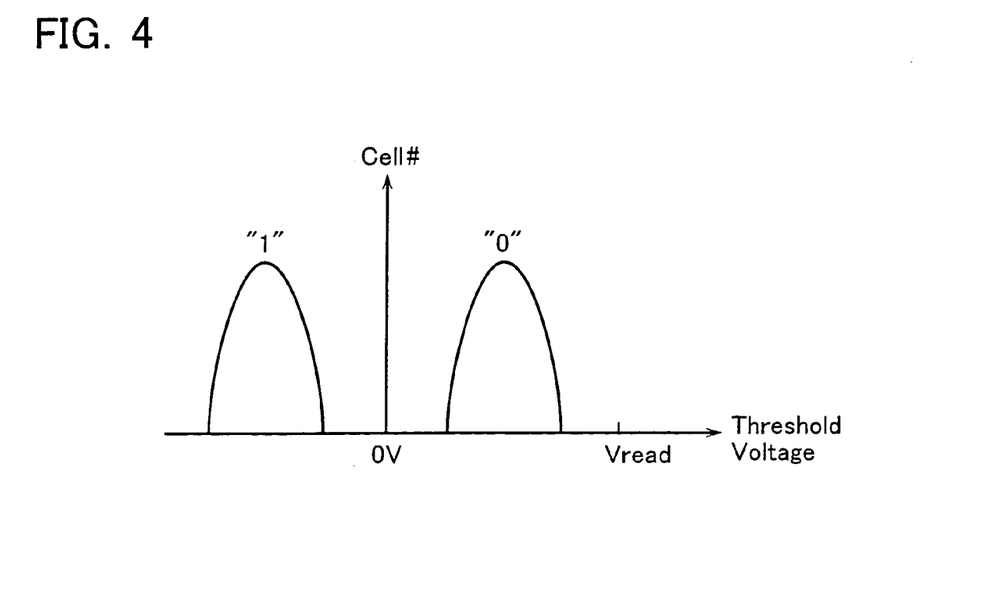
FIG. 4 shows data threshold distributions of the flash memory.

FIG. 4 shows data threshold voltage distributions in case the NAND flash memory device in accordance with this embodiment is used to store binary data. The negative threshold voltage state is defined as data "1" (erase state), and the positive threshold state as data "0" (write state in a narrow sense). Data "0" write is defined as an operation, in which electrons are injected into the floating gate of a selected memory cell from channel thereof by FN tunneling.

In detail, one page data write is done with the steps of: transferring Vss and Vdd–Vth (Vth is threshold voltage of the select gate transistor) to the selected cell's channels of the NAND cell units from the bit lines in correspondence with write data "0" and "1"; and applying a write voltage Vpgm (for example, Vpgm=20V) to a selected word line. In a memory cell or cells applied with "0" data, a large electric field is applied between the floating gate and the cell channel, electrons are injected into the floating gate (i.e., "0" write). In contrast to this, in a memory cell or cells applied with "1" data, the channel will be boosted in potential by capacitive coupling, resulting in that electron injection into the floating gate does not occur (i.e., write inhibited).

Data write is performed, in practice, by repeating write voltage application and verify-read for verifying the write state (i.e., write verify) until the entire write data of one page are completely written.

Figure 5:
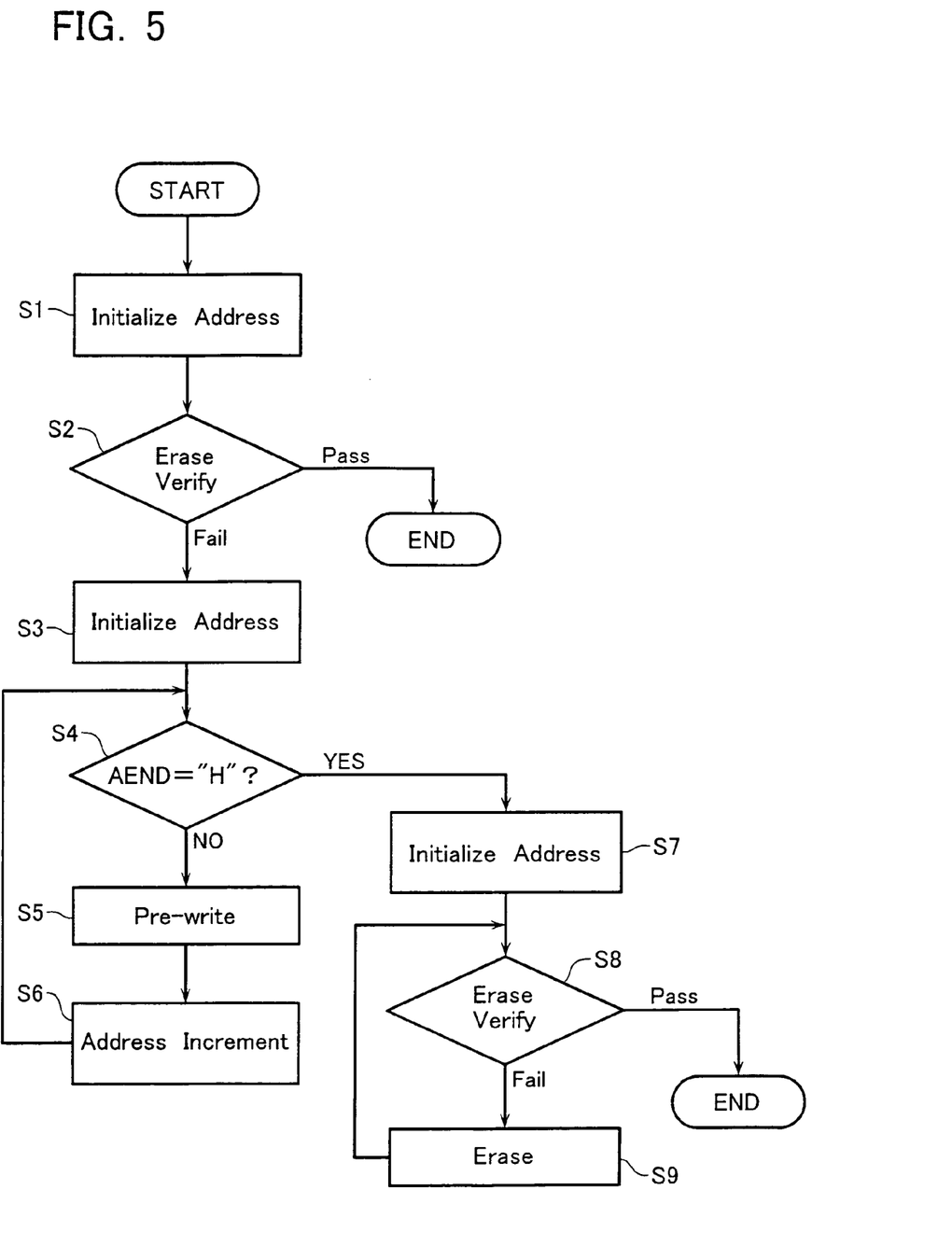
FIG. 5 shows an erase operation flow of the flash memory.

In this embodiment, it is adapted an erase sequence including a confirmation operation for confirming that an erase block has been surely erased, which is recognized as a spare block by a host device. FIG. 5 shows a flow chart of an erase sequence in accordance with this embodiment.

Receiving erase command and address supplied from a host device, the flash memory initializes the row/column addresses (at step S1), and then executes erase-verify for a selected block selected by the address supplied from the host device (at step S2). The bias condition used at the erase-verify is, for example, shown in FIG. 6, which shows only one NAND cell unit. 0V is applied to the entire word lines WLi; a pass voltage Vread to the select gate lines SGD and SGS; and Vss to the common source line CELSRC. The bit line BL is precharged at a certain voltage VBL (<Vdd).

Figure 6:
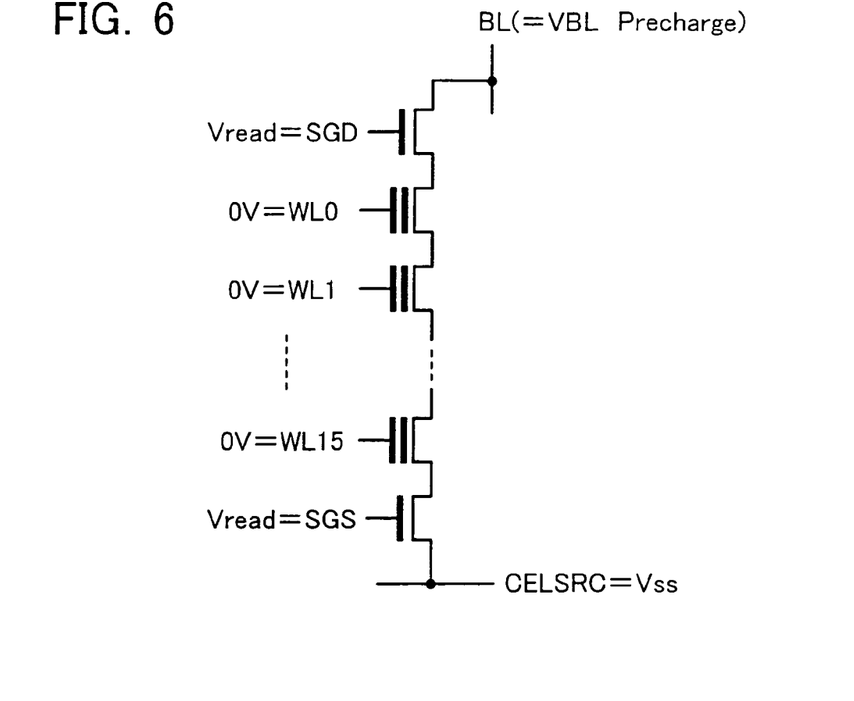
FIG. 6 shows a bias condition at a verify-read time of the flash memory.

With this voltage application, in case the entire memory cells in a NAND cell unit are in erase states with negative threshold voltages, these memory cells become on, and flow channel currents, thereby discharging the corresponding bit line BL. If there is any un-erased memory cell (i.e., "0" data cell), the NAND cell unit does not become conductive, thereby retaining the bit line to be at about the precharged voltage VBL even though it flows a small leakage current. Therefore, detect whether the respective bit lines BL are discharged or not, and it may be judged whether the respective NAND cell units have been erased or not. In practice, the verify judgment is done by detecting whether the entire data nodes N2 have become "H" or not in the entire sense amplifiers as a result of the verify-read.

Outputting a "Pass" flag in case the block erase has been confirmed in the erase-verify judgment step S2, the flash memory ends the erase sequence without proceeding to the practical erase cycles. If it has been judged "Fail" in the erase-verify judgment, the erase cycles will be performed after a preliminary write operation is executed for the selected block prior to the erase operation in order to reduce erase stress influences on the selected block. In detail, the preliminary write (i.e., pre-write) operations are repeated with the steps of: initializing row/column addresses (at step S3); performing pre-write for the head page (at step S5); incrementing the page address (at step S6); and performing pre-write for the next page. Although it is shown an example that verify-read (i.e., write-verify) is not performed in the preliminary write cycles, it should be appreciated that write-verify may be adaptable to the preliminary write cycles. If having been confirmed that write completion (AEND="H") is confirmed from the head page to the last page in the step S4, proceed to erase cycles.

The erase cycles are performed with the steps of: initializing row/column addresses (at step S7); and performing erase-verify for the selected block again (at step S8). The erase-verify is basically the same as that in the step S2. If the verify judgment results in "Fail", erase operation is performed for the selected block (at step S9), and then the erase-verify is performed again (at step S8).

Figure 7:
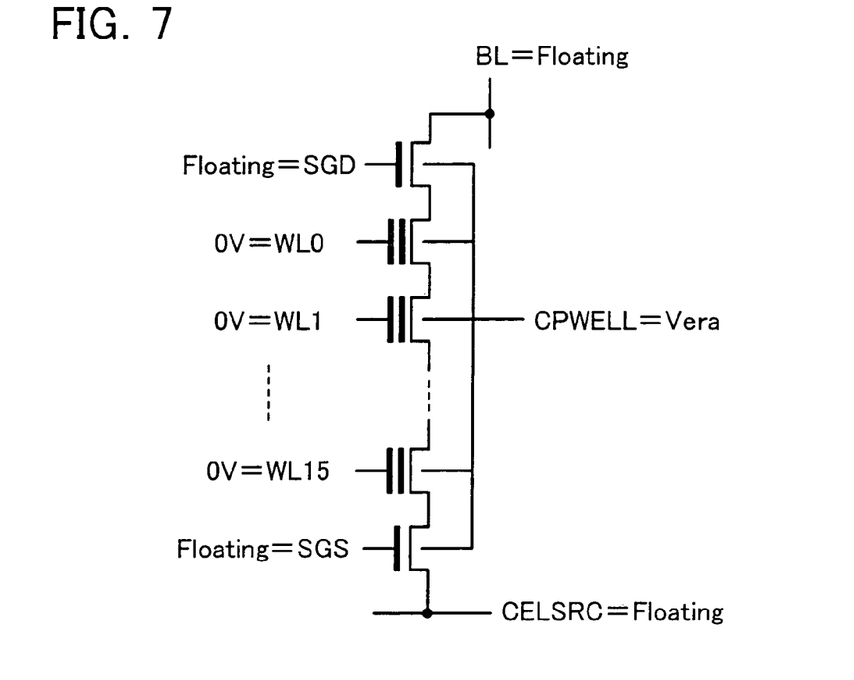
FIG. 7 shows a bias condition at an erase time of the flash memory.

The bias condition of the erase operation is, for example, as shown in FIG. 7. 0V is applied to the entire word lines in the selected block; the select gate lines SGD, SGS, bit lines BL and common source line CELSRC are set in a floating state; A erase voltage Vera (for example, Vera=20V) is applied to a node CPWELL of the p-type well on which the cell array is formed. With this voltage application, electrons stored in the floating gates of the entire memory cells in the selected block will be released to the cell channels. If the erase verify judgment results in "Pass", end the above-described erase operation.

Figure 8:
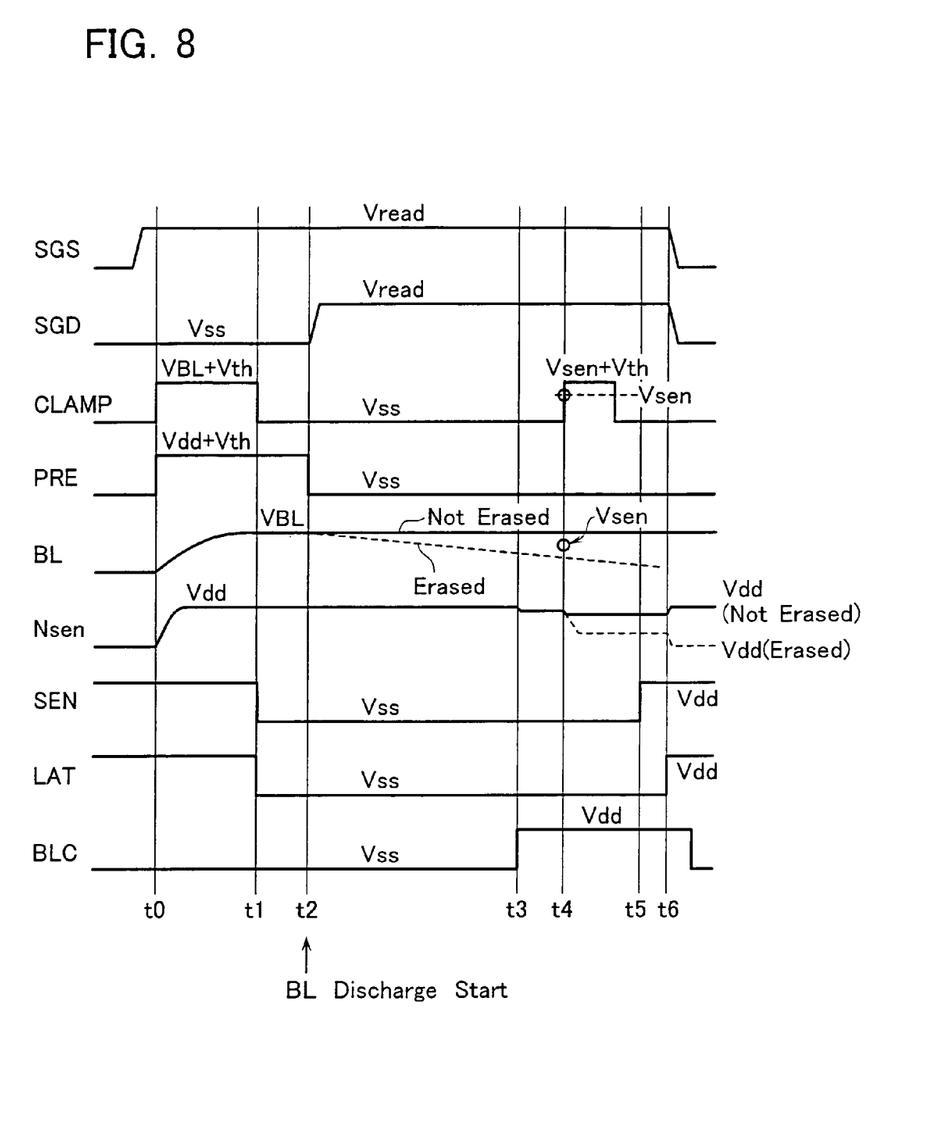
FIG. 8 shows operation waveforms of the erase-verify operation by giving attention to the sense amplifier circuit of the flash memory.

FIG. 8 shows a timing chart of the erase-verify read operation in the steps S2 and S8 taking notice to the sense unit shown in FIG. 3. At timing t0, VBL+Vth (Vth is threshold voltage of NMOS transistor) is applied to the gate node BLCLAMP to turn on the clamping transistor MN1, and Vdd+Vth is applied to the gate node PRE of the precharging transistor MN2 simultaneously. VBL is a voltage lower than the power supply voltage of Vdd. With this voltage application, the bit line BL is precharged at VBL; and the sense node Nsen is to Vdd.

Turn off the clamping transistor MN1, and disable the data latch 21 by letting the sense amplifier activation signals, SEN and LAT, be SEN=LAT="L" at timing t1. Thereafter, turn off the precharging transistor MN2, and apply a "H" level voltage, Vread, to the select gate line SGD located on the bit line side in the selected block at timing t2. The select gate line SGS located on the common source line CELSRC side has been previously applied with the "H" level voltage, and the entire word lines WL also has been previously applied with 0V. Under the voltage application condition, the bit line BL will be discharged in accordance with data. That is, if the entire memory cells in a NAND cell unit have been erased, the corresponding bit line BL is discharged (as shown by a dotted line). In case there is any memory cell, which has not been erased, the corresponding bit line BL is not discharged (as shown by a solid line). Although FIG. 8 shows typical two discharge curves, one being a case where the bit line is discharged; and the other a case where the bit line is not discharged, various bit line discharge curves will be obtained in practice as being different for the respective bit lines from each other in accordance with cells' data threshold voltages in the NAND cell unit.

After a certain waiting time, apply a "H" level to the gate node BLC to turn on the transferring transistor MN3 at timing t3, and apply a sense-use voltage Vsen+Vth to the gate BLCLAMP of the clamping transistor MN1 at timing t4. Vsen is set at a voltage value between "H" level (un-erased) and "L" level (erased) of the bit line at this timing.

In case the entire memory cells in a NAND cell unit have been erased, therefore the bit line voltage has been reduced in potential, the clamping transistor MN1 turns on with the above-described voltage application, whereby the charge of the sense node Nsen and data node N1 is transferred toward the bit line BL. Since the bit line BL has usually a capacitance sufficiently larger than those of the sense node Nsen and data node N1, the sense node Nsen and data node N1 will be reduced to be approximately equal to the bit line voltage level due to the above-described charge distribution. In case the bit line has not been discharged, the clamp transistor MN1 is kept off. Therefore, the sense node Nsen and data node N1 are held at the "H" level.

After having turned off the clamping transistor MN1, let the activation signals SEN and LAT be "H" at timing T5 and T6, respectively. As a result, in case the entire memory cells have been erased, a data state of: N1="L" (=Vss); N2="H" (=Vdd) will be lathed, whereas in case there is an un-erased memory cell(s), a reverse data will be latched. As described above, the verify judgment becomes "Pass" when the data nodes N1 of the entire sense amplifiers are detected to be "H" with the verify check circuit 23.

According to this embodiment described above, the flash memory executes erase-verify for a selected block in the beginning when receiving an erase command, and ends the erase sequence of the selected block without executing pre-write and erase in case it is in an erase state. Therefore, a host device is allowed to issue an erase command for a spare block without checking whether the spare block has been erased or not. As a result, it is possible to avoid a waste of long time that is taken for executing read and erase cycles. Especially, in the NAND-type flash memory, the erase-verify read may be performed by a block in a short time as different from the ordinary read so that this invention has a large merit.

Although, it has been explained, in the above-described embodiment, an erase verify scheme of detecting whether the precharged bit line is discharged or not (or the discharge degree), it is possible to use anther scheme of detecting whether the bit line is charged or not (or the charge degree). In the latter scheme, bit line BL is precharged at 0V, and under the bias condition of: 0V is applied to the entire word lines WL; Vdd to the common source line CELSRC; and pass voltage Vread to the select gate lines SGD and SGS, a cell current is carried from the common source line CELSRC to the bit line BL. If a NAND cell unit has been erased in a state where the upper limit of threshold voltages of the entire memory cells therein is lower than Vt (negative), the bit line will be charged up to |Vt|. By contrast, if there is an un-erased cell, threshold voltage of which is higher than 0V, in the NAND cell unit, no cell current flow, and the bit line BL is held at 0V. By detecting such the bit line charge state, erase-verify may be performed.

[Embodiment 2]

In the operation flow shown in FIG. 5 in the above-described embodiment, the erase-verify operations at steps S2 and S8 are performed with the same verify judgment condition. However, even if the threshold voltages of erased cells have a large and negative value just after having erased, those are changed in the positive direction due to stresses influenced on un-selected memory cells in data read and write modes after erasure. Further, it may be generated a case where the initial erase-verify step S2 is passed, but the second erase-verify step S8 is not passed due to variations of temperature and voltage conditions. Therefore, it is useful that the verify judgment conditions (i.e., verify-read conditions) are set to be different from each other between two steps S2 and S8.

Figure 9:
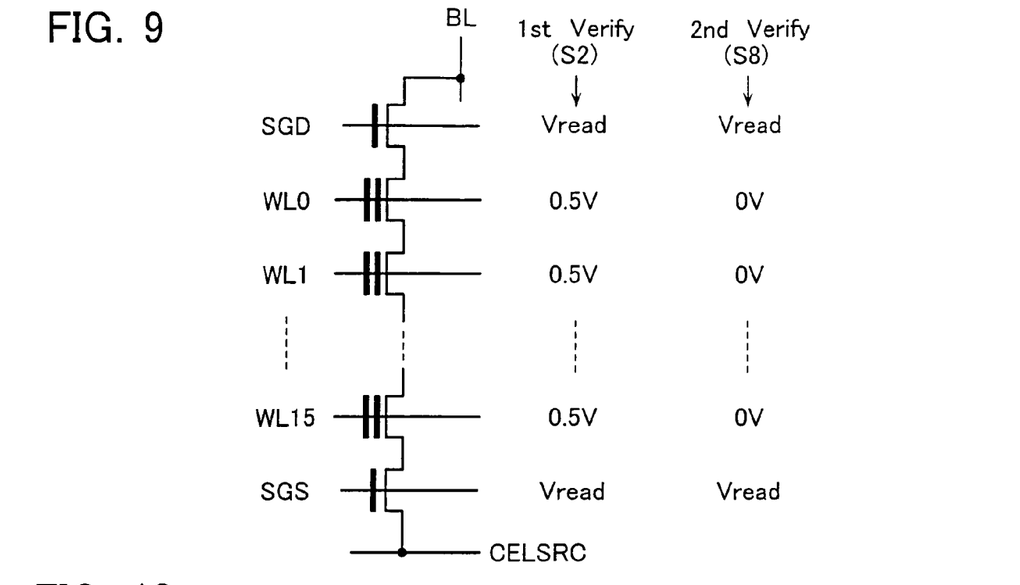
FIG. 9 shows bias conditions at two verify-read times in accordance with another embodiment.

One approach, for the purpose of this, is to set the bias conditions of the memory cells in the erase-verify mode to be different from each other. For example, FIG. 9 shows an example where word lines are applied with 0.5V at the first verify step S2, while they are applied with 0V at the second verify step S8. That is, the verify-read condition at the first verify step is more eased or lightened than that of the second verify step.

Figure 10:
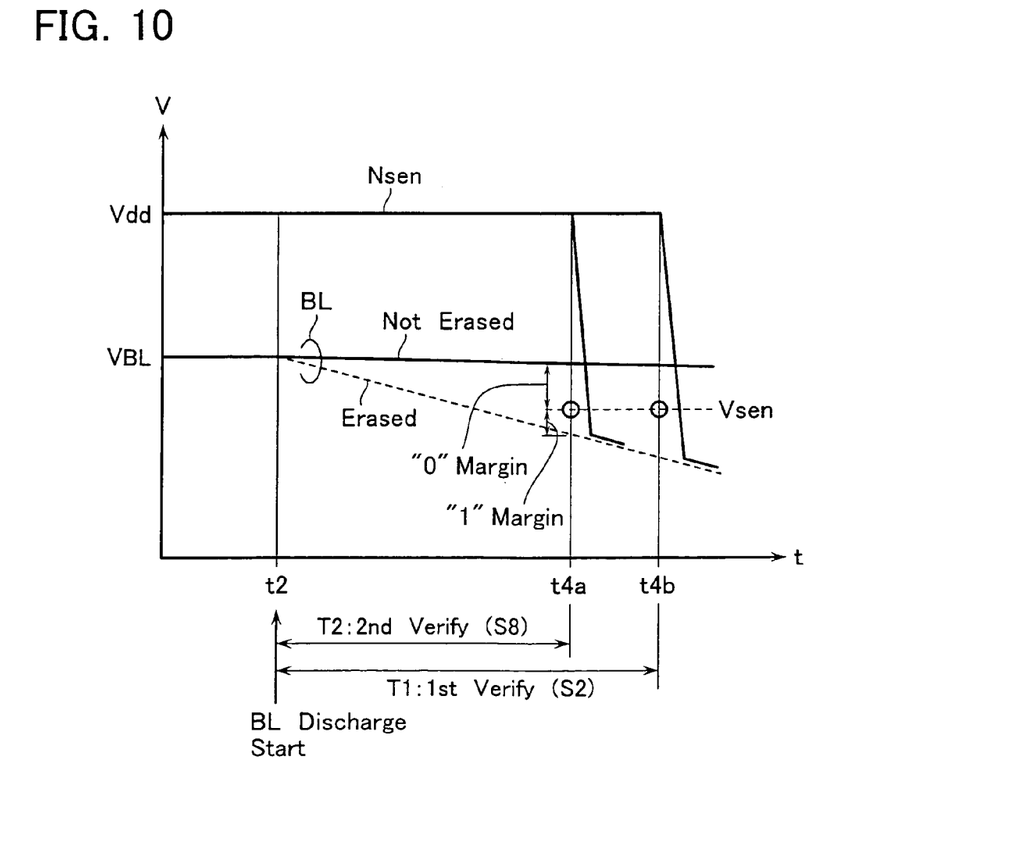
FIG. 10 shows a waveform for explaining the data sense conditions at two verify-read times in accordance with another embodiment.

Another approach is to set the data sense timings of the verify-read modes to be different from each other. As shown in FIG. 10, data sensing margins of "0" (not erased) and "1" (erased) at the verify time are determined based on the bit line discharge time, which is defined as a time length from t2 to t4 (t4a or t4b). Therefore, make the data sensing timings t4 different between the two erase-verify steps S2 and S8, and these verify-read conditions become different from each other.

It is also useful, as a third approach, to set the sensibility of the sense amplifier in the first erase-verify step S2 to be different from that in the second erase-verify step S8. In detail, the sense-use voltages Vsen, which is applied to the gate of the clamping transistor MN1, are made different between two verify steps S2 and S8. This makes, as easily understood from FIG. 10, the verify-read conditions different from each between the two steps.

[Embodiment 3]

The flash memory in the embodiment 1 is designed to execute a series of sequences as shown in FIG. 5 in response to an erase command. By contrast to this, it is possible to prepare a command, which is used only for an erase-verify operation, independently of the erase command, thereby making the erase-verify step S2 shown in FIG. 5 independent of the erase sequence. In this case, it is designed preferably to output a "Pass/Fail" flag of the erase-verify outside of the chip. In accordance with this flag, it becomes possible to select that following block erase operation is to be executed or not.

[Embodiment 4]

A NAND-type flash memory has a feature that power consumption in the erase mode is little because data erase thereof is performed with an FN tunneling current. Due to this, it is easily possible to erase a plurality of blocks simultaneously. Therefore, this invention is effective in a case where plural blocks are simultaneously erased. It should be noted in this case that erase-verify is to be performed by a block.

[Embodiment 5]

Figure 11:
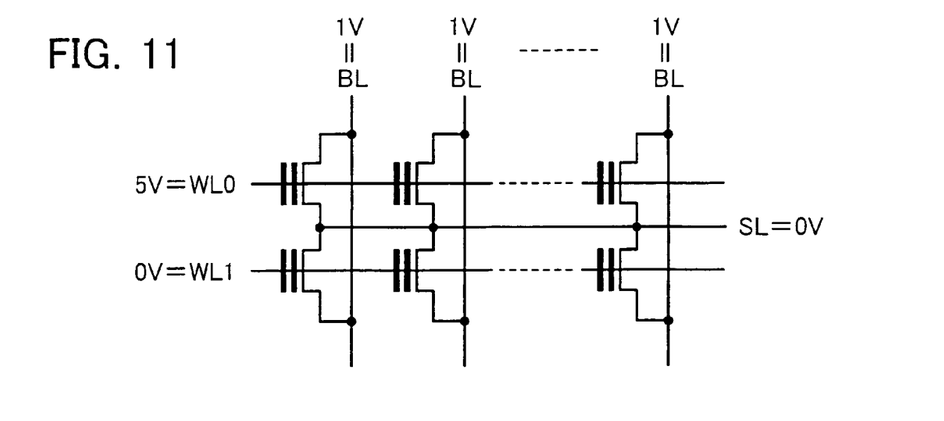
FIG. 11 shows a bias condition at a read time of a NOR-type flash memory.
Figure 12:
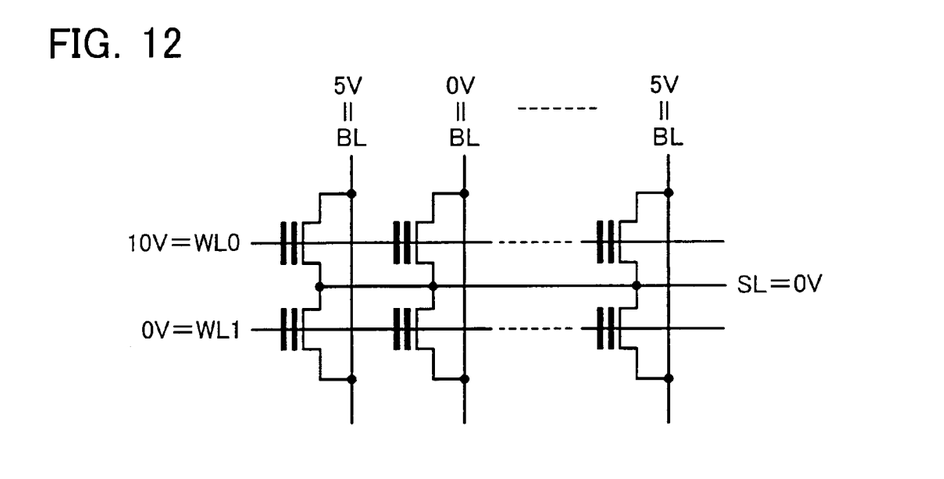
FIG. 12 shows a bias condition at a write time of the NOR-type flash memory.
Figure 13:
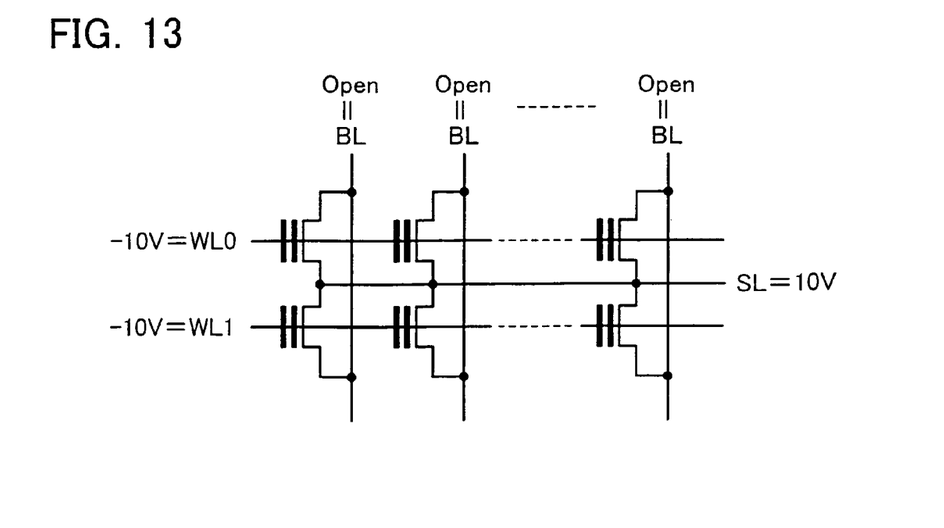
FIG. 13 shows a bias condition at an erase time of the NOR-type flash memory.

Although it has been explained for a NAND-type flash memory in the above-described embodiments, this invention may be adapted to NOR-type flash memories. FIGS. 11 to 13 show bias relationships in the memory cell array in various operation modes of a NOR-type flash memory device.

At a read time, as shown in FIG. 11, a selected word line WL0 is applied with 5V; unselected word line WL1 and source line SL are applied with 0V; and bit lines BL are applied with 1V. With this voltage application, plural memory cells disposed along the selected word line WL0 (i.e., one page cells) may be read.

At a write time, as shown in FIG. 12, 10V is applied to a selected word line WL0; 0V is applied to unselected word line WL1 and source line SL; and 5V and 0V are applied to bit lines BL in accordance with write data. With this voltage application, a large channel current flows in memory cell(s), to which 5V is applied from the bit line BOL, in the entire memory cells disposed along the selected word line WL0, and electrons are generated by impact ionization to be injected into floating gate(s) thereof.

Erasure may be performed by a block. As shown in FIG. 13, bit lines are set in a floating state; word lines in a selected block are applied with −10V; and source line SL is applied with 10V. With this voltage application, the entire memory cells in the selected block release electrons stored in floating gates thereof to source diffusion layers side. That is, the entire memory cells may be erased.

In the NOR-type flash memory, read operations in write-verify and erase-verify are basically performed by a page as similar to that shown in FIG. 11. That is, it is impossible in the NOR-type flash memory to perform erase-verify with a read operation for verifying an erase state of a block unlike NAND-type flash memory. Therefore, although the embodiments 1–4 may be basically adapted to the NOR-type flash memory, it is required of, for example, the erase-verify step S2 shown in FIG. 5 to be repeated for plural pages in the block.

Figure 14:
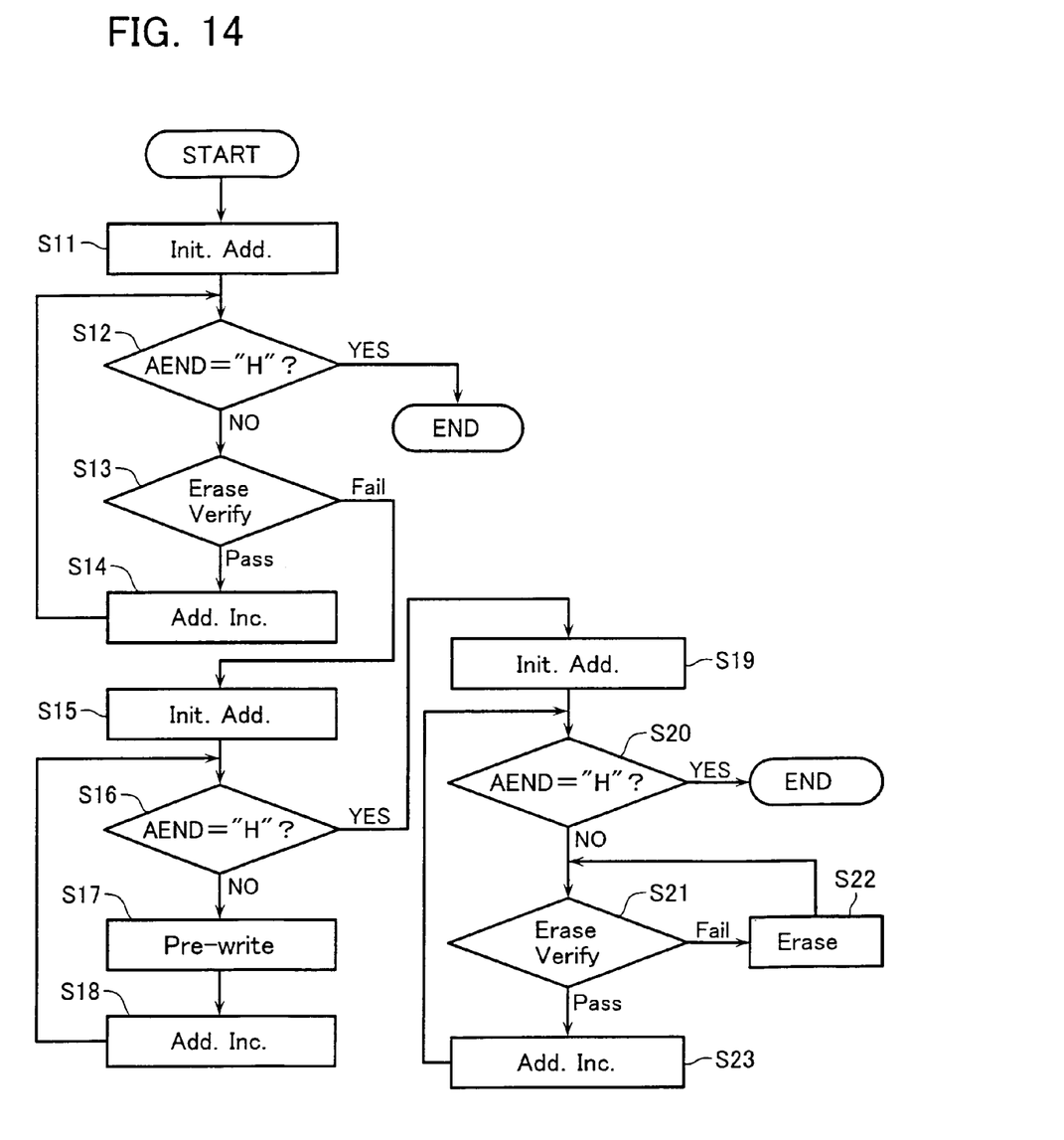
FIG. 14 shows an erase operation flow in am embodiment in which this invention is adapted to the NOR-type flash memory.

In detail, FIG. 14 shows an operation flow to which the erase-sequence as similar to the embodiment 1 is adapted to the NOR-type flash memory. The flash memory receives an erase command supplied from a host device, and then initializes row/column addresses (at step S11). Following it, the flash memory executes erase-verify for a selected block, which is selected by an address signal supplied from the host device (at step S13). If the erase-verify results in "Pass", count up the address (at step S14), and judge whether it has been proceeded to the final address (AEND="H") or not (at step S12). These erase-verify operations will be repeatedly performed page by page. If the erase-verify operation has reached the final address without outputting "Fail", this designates that the block erase has been verified. In this case, the flash memory outputs a "Pass" flag outside of the chip, and ends the erase operation flow without proceeding to practical erase cycles.

If it has been judged "Fail" in the erase-verify judgment, the erase cycles will be performed after a preliminary write operation is executed for the selected block prior to the erase operation in order to reduce erase stress influences on the selected block. In detail, the preliminary write (i.e., pre-write) operations are repeated with the steps of: initializing row/column addresses (at step S15); performing pre-write for the head page (at step S17); incrementing the page address (at step S18); and performing pre-write for the next page. Although it is shown an example that verify-read (i.e., write-verify) is not performed in the preliminary write cycles, it should be appreciated that write-verify may be adaptable to the preliminary write cycles. If having been confirmed that write completion (AEND="H") is confirmed from the head page to the last page in the step S16, proceed to erase cycles.

The erase cycles are performed with the steps of: initializing row/column addresses (at step S19); and performing erase-verify for the selected block again. The erase-verify steps S20–S23 are performed by a page as basically similar to those in the step S12–S14. If the verify judgment results in "Fail", erase operation is performed for the selected block at a time (at step S22), and then the erase-verify is performed again (at step S21). The erase-verify having reaches the final page, the above-described erase operation ends.

[Embodiment 6]

As an embodiment, an electric card using the non-volatile semiconductor memory devices according to the above-described embodiments 1–5 of the present invention and an electric device using the card will be described bellow.

Figure 15:
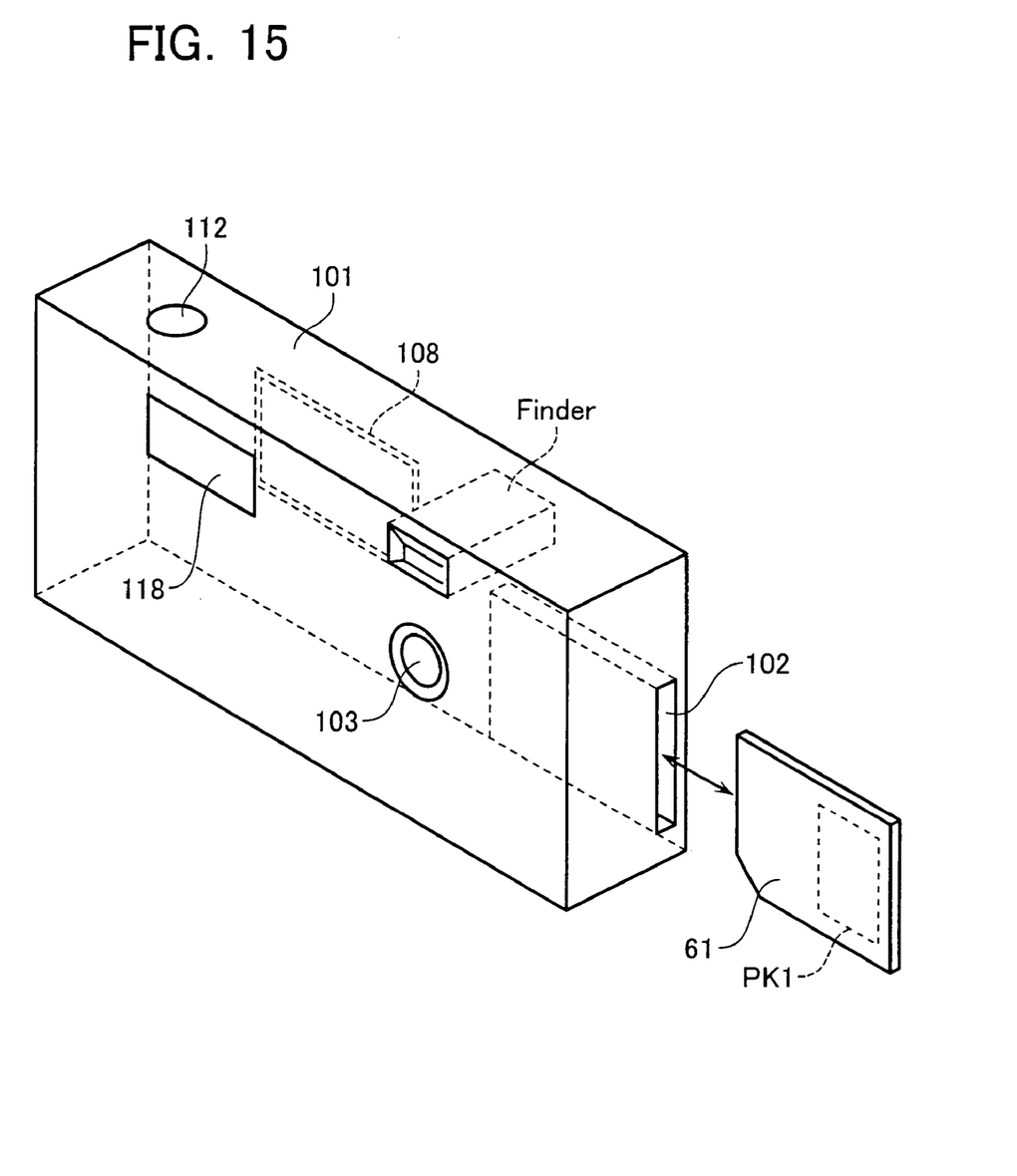
FIG. 15 shows another embodiment applied to a digital still camera.

FIG. 15 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 16:
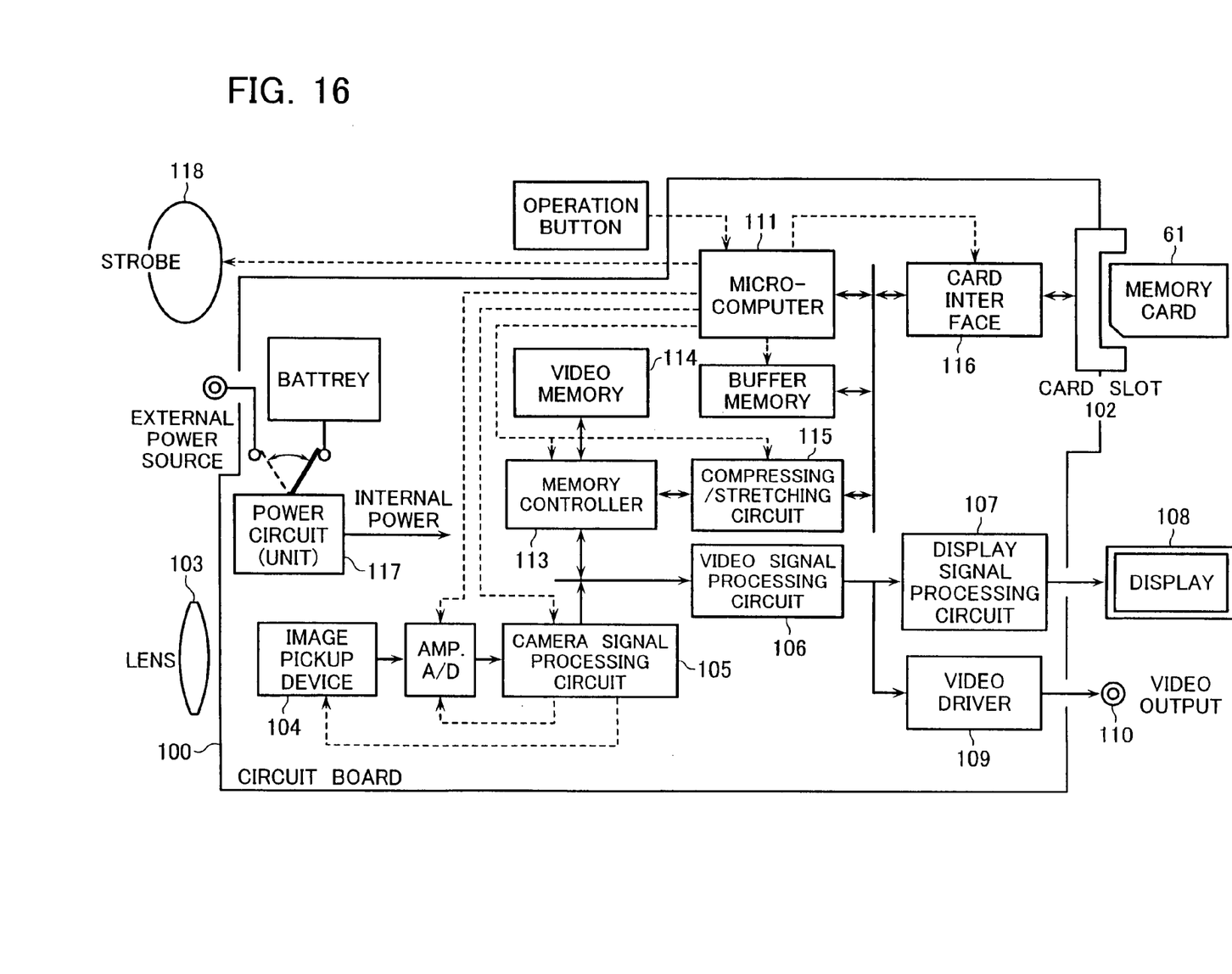
FIG. 16 shows the internal configuration of the digital still camera.
Figure 17A:
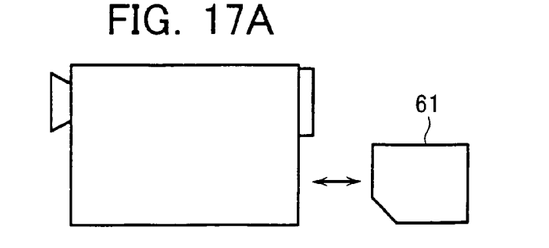
FIGS. 17A to 17J show other electric devices to which the embodiment is applied.
Figure 17B:
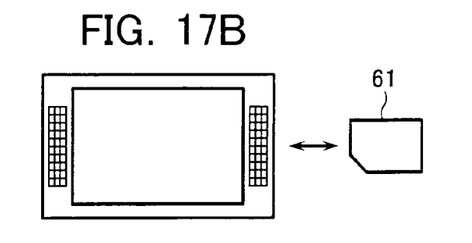
Figure 17C:
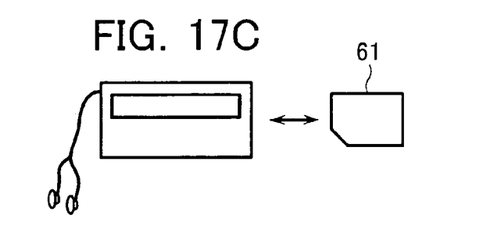
Figure 17D:
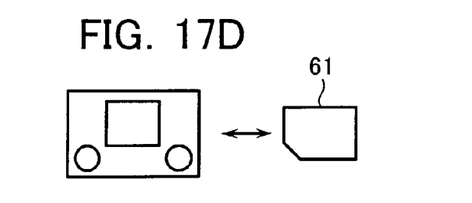
Figure 17E:
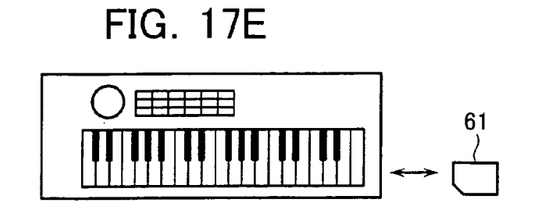
Figure 17F:
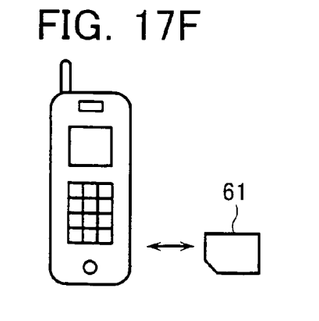
Figure 17G:
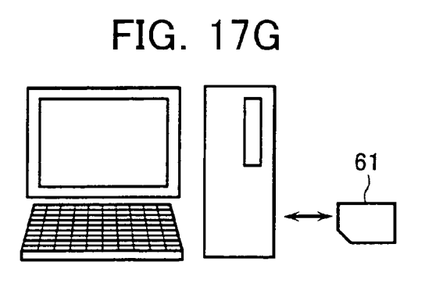
Figure 17H:
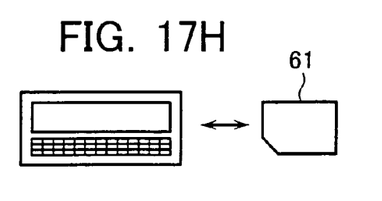
Figure 17I:
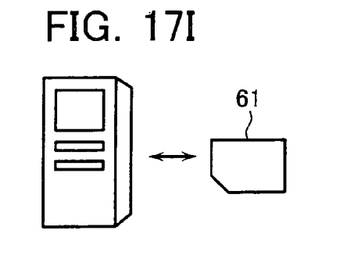
Figure 17J:
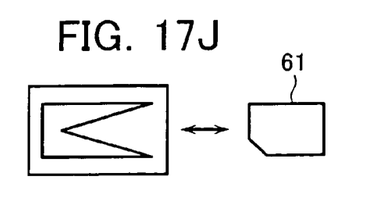

FIG. 16 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 17A to 17J, as well as in portable electric devices. That is, the electric card can also be used in a video camera shown in FIG. 17A, a television set shown in FIG. 17B, an audio apparatus shown in FIG. 17C, a game apparatus shown in FIG. 17D, an electric musical instrument shown in FIG. 17E, a cell phone shown in FIG. 17F, a personal computer shown in FIG. 17G, a personal digital assistant (PDA) shown in FIG. 17H, a voice recorder shown in FIG. 17I, and a PC card shown in FIG. 17J.

What is claimed is:

1. A non-volatile semiconductor memory device comprising:

a cell array with electrically rewritable and non-volatile memory cells arranged therein;

a sense amplifier circuit configured to read data of and write data into said cell array; and a controller configured to control read, write and erase said cell array, wherein said controller executes an erase sequence for erasing a selected block in said cell array in response to erase command and address input, the erase sequence including executing a first erase-verify operation for verifying an erase state of the selected block on receiving an erase command;

executing a first erase operation of the selected block after the first erase-verify operation if the first erase-verify operation acknowledges that a previous erasing was not successful; and ending the erase sequence without executing the first erase operation if the first erase-verify operation acknowledges that the previous erasing was successful.

2. The non-volatile semiconductor memory device according to claim 1, wherein said controller executes a preliminary write operation for the selected block prior to the erase operation in order to reduce erase stress influenced on the selected block.

3. The non-volatile semiconductor memory device according to claim 1, wherein the erase operation of the selected block is performed by repeating a second erase-verify operation for verifying the erase state of the selected block and an erase voltage application operation for applying an erase voltage to the selected block until the erase state is verified, and wherein verify-read conditions in the first and second erase-verify operations are different from each other.

4. The non-volatile semiconductor memory device according to claim 3, wherein the first and second erase-verify operations are performed by data sensing at predetermined timings with said sense amplifier circuit by applying the respective read biases to memory cells in the selected block, and wherein the verify-read conditions are made different based on setting the respective read biases to be different from each other.

5. The non-volatile semiconductor memory device according to claim 3, wherein the first and second erase-verify operations are performed by data sensing at predetermined timings with said sense amplifier circuit by applying the respective read biases to memory cells in the selected block, and wherein the verify-read conditions are made different based on setting the data sense timings to be different from each other.

6. The non-volatile semiconductor memory device according to claim 3, wherein the first and second erase-verify operations are performed by data sensing at predetermined timings with said sense amplifier circuit by applying the respective read biases to memory cells in the selected block, and wherein the verify-read conditions are made different based on setting the sensibility of said sense amplifier circuit in the first erase-verify operation to be different from that in the second erase-verify operation.

7. The non-volatile semiconductor memory device according to claim 1, wherein the first erase-verify operation is executed in response to a specified command input independently of the erase sequence.

8. The non-volatile semiconductor memory device according to claim 1, wherein said cell array has a plurality of NAND cell units arranged therein, each NAND cell unit being formed of: memory cells connected in series, control gates of which are coupled to different word lines; a first select gate transistor coupling one end of the memory cells connected in series to a bit line; and a second select gate transistor coupling the other end to a common source line, said cell array being divided into plural blocks in the bit line direction each defined as a set of NAND cell units sharing a word line.

9. The non-volatile semiconductor memory device according to claim 8, wherein said sense amplifier circuit comprises:
a clamping transistor disposed between a sense node and a bit line of said cell array for clamping a bit line voltage and for serving as a pre-sense amplifier;
a precharging transistor coupled to the sense node for precharging the sense node and the bit line; and
a data latch disposed for sensing bit line data and latch it, which is transferred to the sense node via the clamping transistor.

10. The non-volatile semiconductor memory device according to claim 1, wherein said device is formed as a NOR-type of memory, and the first erase-verify operation is so performed by repeating a page erase-verify operation as to verify the erase state of the selected block.

11. An electric card equipped with a non-volatile semiconductor memory device, said device comprising:

a cell array with electrically rewritable and non-volatile memory cells arranged therein;
a sense amplifier circuit configured to read data of and write data into said cell array; and
a controller configured to control read, write and erase said cell array, wherein
said controller executes an erase sequence for erasing a selected block in said cell array in response to erase command and address, the erase sequence including:
executing a first erase-verify operation for verifying the erase state of the selected block on receiving an erase command;
executing a first erase operation of the selected block after the first erase-verify operation if the first erase-verify operation acknowledges that a previous erasing was not successful; and
ending the erase sequence without executing the first erase operation if the first erase-verify operation acknowledges that the previous erasing was successful.

12. An electric device comprising:

a card interface;
a card slot connected to said card interface; and
an electric card defined in claim 11 and electrically connectable to said card slot.

13. A method of controlling an erase sequence of a non-volatile semiconductor memory device, the erase sequence being to erase a selected block in response to erase command and address input, comprising:

initially executing a first erase-verify operation for verifying an erase state of the selected block on receiving an erase command;
executing a first erase operation of the selected block after the first erase-verify operation if the first erase-verify operation acknowledges that a previous erasing was not successful; and
ending the erase sequence without executing the first erase operation if the first erase-verify operation acknowledges that the previous erasing was successful.

14. The method according to claim 13, further comprising:

executing a preliminary write operation for the selected block prior to the erase operation in order to reduce erase stress influenced on the selected block.

15. The method according to claim 13, wherein the erase operation of the selected block is performed by repeating a second erase-verify operation for verifying the erase state of the selected block and an erase voltage application operation for applying an erase voltage to the selected block until the erase state is verified, and wherein verify-read conditions in the first and second erase-verify operations are different from each other.

16. The method according to claim 15, wherein the first and second erase-verify operations are performed by data sensing at predetermined timings with a sense amplifier circuit by applying the respective read biases to memory cells in the selected block, and wherein the verify-read conditions are made different based on setting the respective read biases to be different from each other.

17. The method according to claim 15, wherein the first and second erase-verify operations are performed by data sensing at predetermined timings with a sense amplifier circuit by applying the respective read biases to memory cells in the selected block, and wherein the verify-read conditions are made different based on setting the data sense timings to be different from each other.

18. The method according to claim 15, wherein the first and second erase-verify operations are performed by data sensing at predetermined timings with a sense amplifier circuit by applying the respective read biases to memory cells in the selected block, and wherein the verify-read conditions are made different based on setting the sensibility of said sense amplifier circuit in the first erase-verify operation to be different from that in the second erase-verify operation.

19. The method according to claim 13, wherein the first erase-verify operation is executed independently of the erase sequence in response to a command.

20. The method according to claim 13, wherein said device includes a cell array with a plurality of NAND cell units arranged therein, each NAND cell unit being formed of: memory cells connected in series, control gates of which are coupled to different word lines; a first select gate transistor coupling one end of the memory cells connected in series to a bit line; and a second select gate transistor coupling the other end to a common source line, said cell array being divided into plural blocks in the bit line direction each defined as a set of NAND cell units sharing a word line.

* * * * *